United States Patent
Cheng et al.

(10) Patent No.: US 8,295,042 B2
(45) Date of Patent: Oct. 23, 2012

(54) ADJUSTABLE RETENTION LOAD PLATE OF ELECTRICAL CONNECTOR ASSEMBLY

(75) Inventors: Chih-Pi Cheng, Tu-Cheng (TW); Chi-Nan Liao, Tu-Cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 267 days.

(21) Appl. No.: 12/686,398

(22) Filed: Jan. 13, 2010

(65) Prior Publication Data

US 2010/0177477 A1    Jul. 15, 2010

(51) Int. Cl.
  *H05K 7/20*  (2006.01)
  *G06F 1/20*  (2006.01)
(52) U.S. Cl. ......... 361/679.52; 361/679.46; 361/679.47; 361/702; 361/711; 361/718
(58) Field of Classification Search .............. 361/679.46, 361/679.47, 679.52, 702, 711, 718
See application file for complete search history.

(56) References Cited

U.S. PATENT DOCUMENTS

| | | | |
|---|---|---|---|
| 5,722,848 A | 3/1998 | Lai et al. | |
| 6,141,220 A * | 10/2000 | Lin | 361/704 |
| 6,504,712 B2 * | 1/2003 | Hashimoto et al. | 361/679.54 |
| 6,678,160 B1 * | 1/2004 | Liu | 361/719 |
| 6,826,052 B2 * | 11/2004 | Ma | 361/709 |
| 6,894,898 B2 * | 5/2005 | Liu | 361/697 |
| 7,001,197 B2 | 2/2006 | Shirai et al. | |
| 7,126,824 B2 * | 10/2006 | Lee et al. | 361/704 |
| 7,252,517 B2 * | 8/2007 | Ju | 439/73 |
| 7,435,124 B2 * | 10/2008 | Ma et al. | 439/331 |
| 7,539,027 B2 * | 5/2009 | Callahan et al. | 361/803 |
| 7,542,293 B2 * | 6/2009 | Zhao et al. | 361/700 |
| 7,628,651 B2 * | 12/2009 | Yeh | 439/607.37 |
| 7,690,926 B2 * | 4/2010 | Yeh et al. | 439/73 |
| 7,699,637 B2 * | 4/2010 | Yeh | 439/331 |
| 7,736,153 B2 * | 6/2010 | Cheng et al. | 439/66 |
| 7,794,261 B2 * | 9/2010 | Terhune et al. | 439/331 |
| 7,841,884 B2 * | 11/2010 | Ma | 439/331 |
| 2002/0081882 A1 * | 6/2002 | Lai et al. | 439/259 |
| 2004/0125567 A1 * | 7/2004 | Lee et al. | 361/707 |
| 2005/0090136 A1 * | 4/2005 | Liao et al. | 439/331 |
| 2005/0094379 A1 * | 5/2005 | Lee et al. | 361/719 |
| 2005/0233628 A1 * | 10/2005 | Yang et al. | 439/331 |
| 2006/0057878 A1 * | 3/2006 | Szu | 439/331 |
| 2006/0105608 A1 * | 5/2006 | Ma | 439/331 |
| 2009/0101318 A1 * | 4/2009 | Ma | 165/104.33 |
| 2009/0197454 A1 * | 8/2009 | Liao | 439/331 |
| 2009/0227135 A1 * | 9/2009 | Liao | 439/345 |
| 2009/0305524 A1 * | 12/2009 | Lin et al. | 439/68 |
| 2009/0311885 A1 * | 12/2009 | Cheng et al. | 439/65 |

* cited by examiner

*Primary Examiner* — Anatoly Vortman
(74) *Attorney, Agent, or Firm* — Wei Te Chung; Ming Chieh Chang

(57) ABSTRACT

An electrical connector assembly electrically connecting a CPU and a printed circuit board includes an electrical connector mounted on the printed circuit board, and a heat dissipating device mounted upon the CPU. The heat dissipating device includes a load plate, a heat pipe, and a heat plate. The load plate is mounted upon the CPU under condition that heat generated from the CPU is absorbed by the heat pipe and the heat plate. The load plate is sandwiched between the heat plate and the heat pipe. The load plate has two clips each of which has two cantilever arms extending toward and engaging with the other clip.

20 Claims, 6 Drawing Sheets

ADJUSTABLE RETENTION LOAD PLATE OF ELECTRICAL CONNECTOR ASSEMBLY

BACKGROUND OF THE INVENTION

1. Field of the Invention

The present invention relates to a retention load plate, and more particularly to a retention load plate configured with a pair of moveably interlocked bars capable of moving toward and away from each other to adjust a span defined therebetween.

2. Description of the Prior Art

U.S. Pat. No. 5,722,848 issued to Lai on Mar. 3, 1998 discloses a typical connector socket, which is generally referred to as a ZIF (Zero Insertion Force) socket. In general, the socket includes a base with a plurality of contacts assembled therein, and a cover movably attached to the base. A lever with a cam mechanism is arranged between the base and the cover to drive the cover from a first position to a second position. When the lever is located in a vertical position, the cover is located at the first position, where a hole in the cover is completely in alignment with a corresponding passageway in the base. In this position, pins of a CPU can be inserted from the cover into the passageways without any engagement with the contact. When the CPU is properly seated on the cover, the lever is moved from the vertical position to a horizontal position, and simultaneously drives the cover from the first position to the second position. During this process, the pins of the CPU are then in contact with the contact within the base. The Lai '848 is specially used in a desk-top computer.

CPU socket used in a notebook is substantially similar to the one used in the desktop computer, and the key difference therebetween is that the lever used on the Lai '848 patent is replaced by a cam mechanism. When the cam mechanism is driven to rotate, the cover is driven to move along the base, therefore the pins of the CPU are then in contact with the contacts within the base, and since this is well known to the skilled in the art as well as laymen, no detailed description is given here for simplicity.

U.S. Pat. No. 7,001,197 issued to Shirai on Feb. 21, 2006 discloses another type of socket, which can be generally called LGA socket. The original pins type of chip occupies more space on the bottom surface of the CPU. In order to increase input/output speed, conductive pads are introduced to replace the pins so as to directly and electrically contact with contact terminals within the socket. No doubt, the speed is increased.

As clearly shown in Figures of Shirai '197, it features different configuration from to what Lai '848 discloses. The socket generally includes a metallic stiffener with a housing securely supported therein. Then a metallic clip is pivotally assembled to the stiffener. On the other hand, the clip is pivotally assembled to one side of the stiffener, and a lever has a cam which can lock the clip to a closed position when the clip is closed to the stiffener. By this arrangement, the CPU is seated on the housing before the clip is closed, and then the clip will tightly press the CPU toward the housing for ensuring proper electrical connection therebetween.

Shirai '197 can be applied to the desktop computer for it has more room for the operation of the lever, while it is almost impossible to apply Shirai '197 directly to the notebook in view of its small space.

Another factor to be considered is the configuration of the CPU. The CPU generally includes a substrate and a die mounted upon the substrate. Although the CPU is rigid, it is still vulnerable to be deformed when there is downward force applied thereon if the downward force is not evenly distributed. In Shirai '197 patent, the die is not pressed by the clip which has a window for it. The die is in direct contact with a heat sink.

Therefore, when installing an LGA socket into a notebook computer, the task of the even distribution of the downward force to both the die and the substrate is a difficult one, and therefore, serves as a motive for the present invention.

The configuration of heat sink is another factor to be considered. Typically, the heat sink device includes a bottom plate and a plurality of parallel heat sink fins disposed on the bottom plate. As the heat sink generally has a bulky configuration, it can be applied to a desktop computer which has a large space, but it is almost impossible to be applied to a notebook which has no sufficient space.

Therefore, there is a need to supply an improved electrical connector assembly with a heat dissipating device.

SUMMARY OF THE INVENTION

Accordingly, an object of the present invention is to provide an electrical connector assembly having a heat dissipating device with a load plate which can dissipate heat for a CPU (Central Process Unit) and exert an evenly-distributed downward force to the CPU to prevent the CPU from warping or any inadvertent damages.

In order to achieve the object set forth, a load plate adapted to provide a loading force for pressing a CPU to an insulative housing with contacts comprises at least a pair of clips. Each clip comprises a base portion and a pair of cantilever arms extending upwardly from the base portion and located on a higher horizontal plane than that of the base portion. A interlocking portion is horizontally and vertically extending from at least one of the cantilever arms. The pair of clips are positioned oppositely, and the interlocking portion of one of the clips mates the cantilever arm of the other clip.

In order to further achieve the object set forth, an electrical connector assembly electrically connecting a CPU and a printed circuit board comprises an electrical connector mounted on the printed circuit board, and the CPU mounted upon the connector. A heat dissipating device has a load plate mounted upon the CPU under condition that heat from the CPU is absorbed by the heat dissipating device. The load plate has two clips and each clip has cantilever arms extending toward each other, and at least one a clip mates the cantilever arm of the other clip.

DESCRIPTION OF PREFERRED EMBODIMENT

Reference will now be made to the drawings to describe the present invention in detail.

Figure 1:
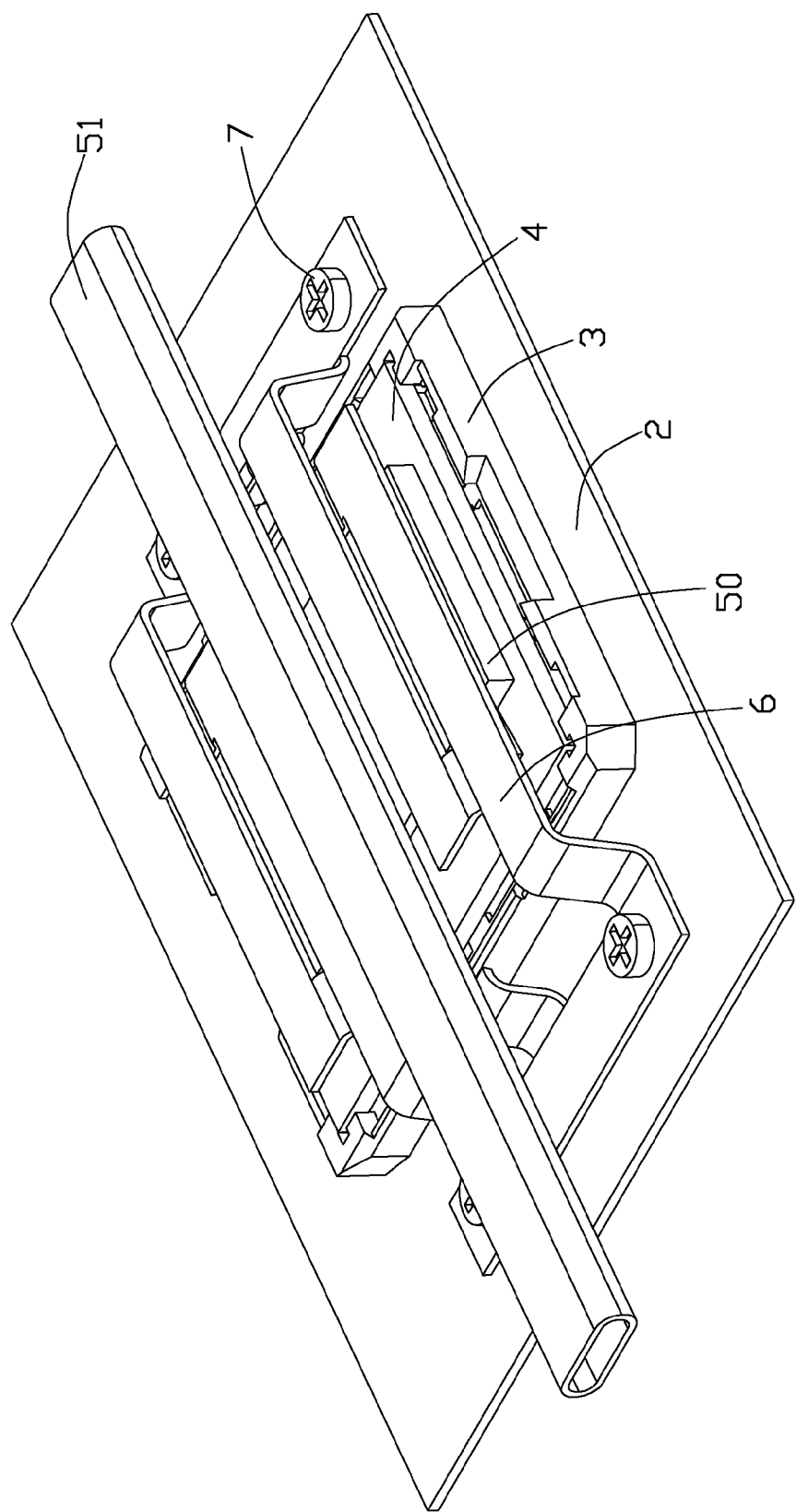
FIG. 1 is an assembled perspective view of an electrical connector assembly according to the present invention.
Figure 2:
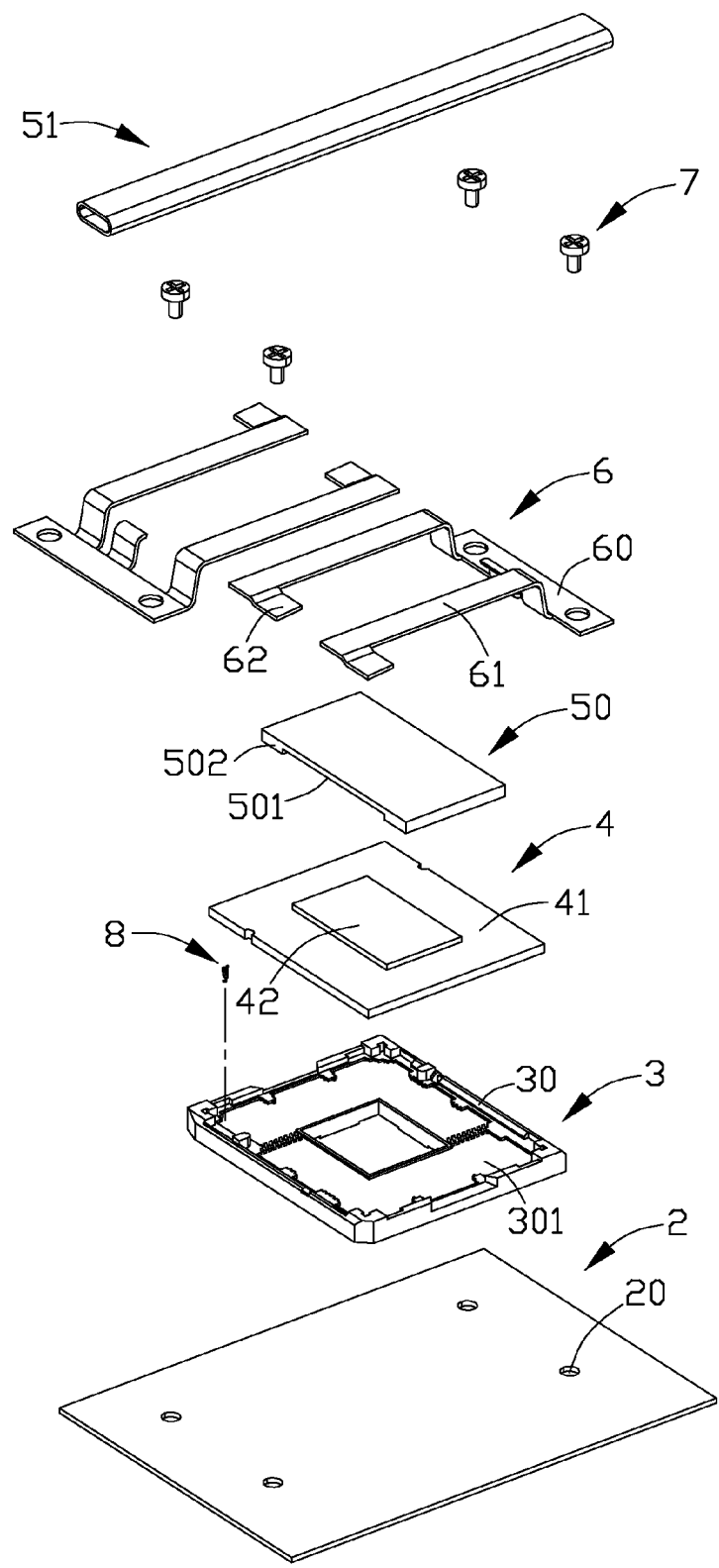
FIG. 2 is an exploded perspective view of the electrical connector assembly of FIG. 1.

Referring to FIGS. 1 and 2, an electrical connector assembly is mounted to a printed circuit board 2 for electrically connecting a CPU (Central Process Unit) 4. The electrical connector assembly comprises an electrical connector 3, a heat dissipating device mounted upon the CPU 4 with a load plate fixing the CPU 4 in the electrical connector 3.

Continue to referring to FIG. 2, the electrical connector 3 includes an insulative housing 30 and a plurality of contacts 8 received in the insulative housing 30. The electrical connector 3 is mounted on the printed circuit board 2 having a number of holes 20 surrounding the electrical connector 3. The insulative housing 30 has a cavity 301 facing upwardly to receive the CPU 4 so that an electrical connection is established between the CPU 4 and the contacts 8. The CPU 4 substantially comprises a planar substrate 41 and a die 42 protruded from a top surface of the substrate 41.

The dissipating device comprises a heat plate 50 and a pair of heat pipes 51. The load plate is positioned between the heat plate 50 and the heat pipes 51. The heat plate 50 is formed with a rectangular configuration, and comprises a pair of supporting portions 502 to attach to the substrate 41 of the CPU 4 and a recess 501 defined between the supporting portions 502 for receiving and attaching to the die 42 of the CPU 4 such that the substrate 41 and the die 42 both endure a downwardly balanced force.

Figure 3:
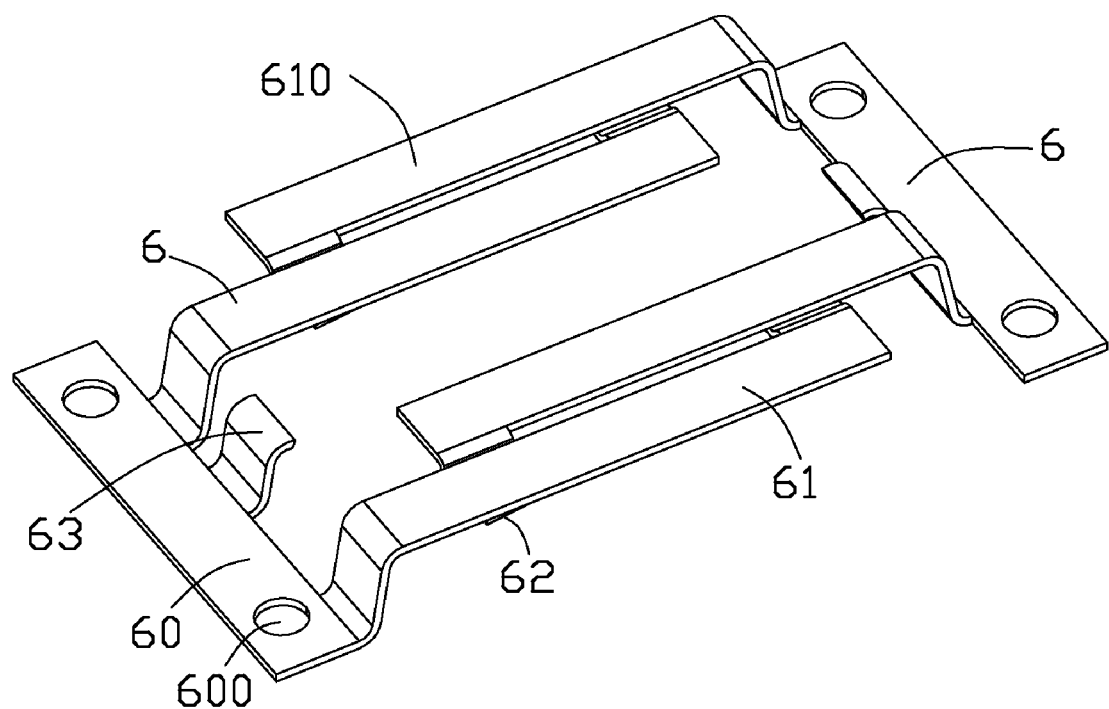
FIG. 3 is an assembled perspective view of a load plate of the electrical connector assembly.

The load plate includes a pair of clips 6 and is used to exert a downward force to the CPU 4 and the heat plate 50 to achieve a reliable electrical connection between the CPU 4 and the electrical connector 3. Referring to FIGS. 2 and 3, the first embodiment of the present invention, the pair of the clips 6 have the same configurations. Each of the clips 6 has a planar base portion 60, and a pair of parallel cantilever arms 61 extending from a same side of the base portion 60, each cantilever arm 61 having a interlocking portion 62 extending perpendicular to the cantilever arm 61. The base portion 60 is attached to the printed circuit board 2 by a plurality of screws 7 passed through the holes 600 of the base portion 60 and the holes 20 of the printed circuit board 2. A tongue 63 is extending upwardly from the base portion 60 and located between the pair of cantilever arms 61 but not extending all the way to the middle position. The spring arm 61 firstly extends upwardly and then extends horizontally to form a long horizontal arm 610. The interlocking portions 62 of the clip 6 are disposed at a free end of the spring arm 61 and laterally extend to a same direction. The interlocking portion 62 has a different height with the horizontal arm 610, and the height difference is substantially equal to the thickness of the horizontal arm 610. The interlocking portions 62 of the one clip 6 are displaced at a bottom of the horizontal arms 610 of the cantilever arms 61 of the other clip 6 so that the four horizontal arms 610 are positioned at a same plane.

Figure 4:
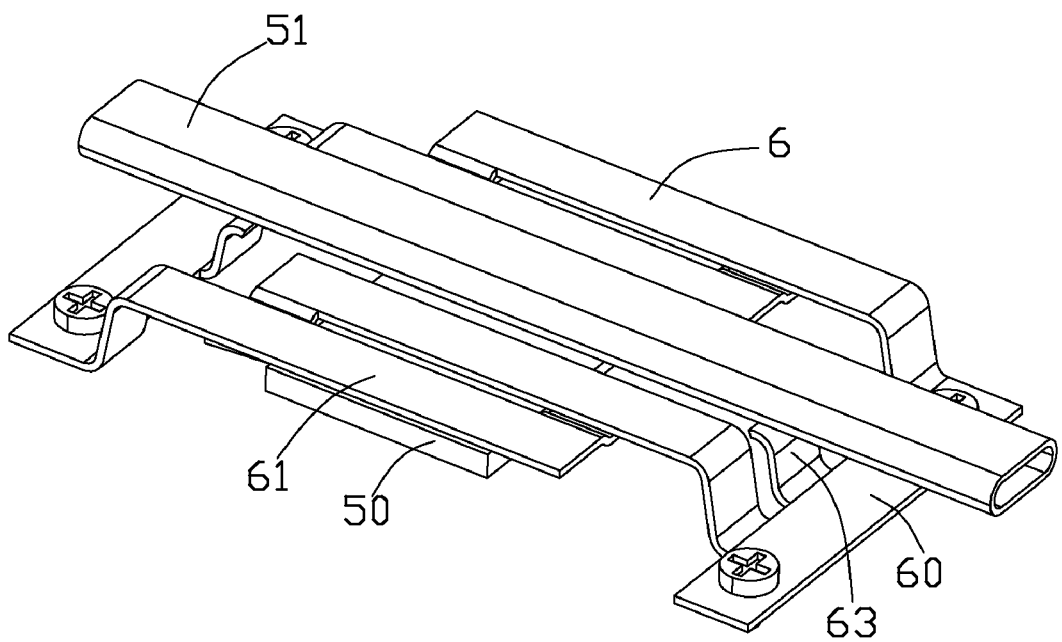
FIG. 4 is an assembled perspective view of a heat dissipating device of the electrical connector assembly.
Figure 5:
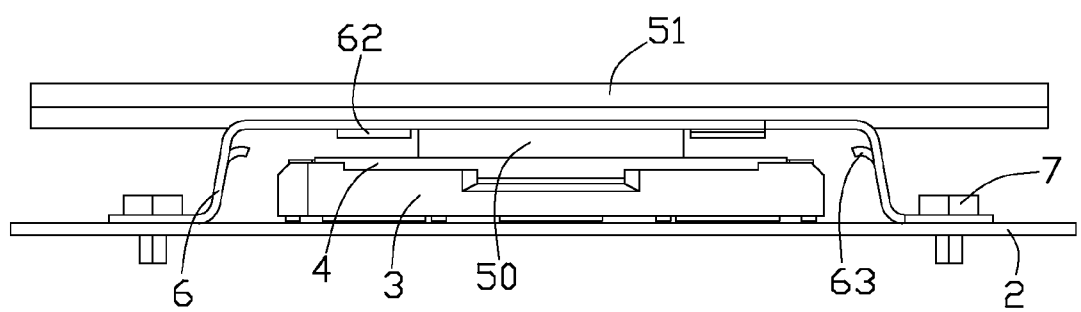
FIG. 5 is a side view of the electrical connector assembly of FIG. 1.

Referring to FIG. 4, in the present invention, the heat pipe 51 can be firstly soldered to the heat plate 50 to dissipate heat. Then the pair of clips 6 are assembled between the heat pipes 51 and the heat plate 50 and mate with each other to form the heat dissipating device. In this arrangement, the four horizontal arms 610 all can be displaced on a top surface of the heat plate 50 so as to exert a balanced force to the heat plate 50, and the interlocking portions 62 are displaced beyond the heat plate 50. The heat dissipating device will not be easily loosen after assembly because the tongues 63 can support the heat pipe 51 in a vertical direction to restrict the heat pipe 51 such that the clips 6, the heat pipe 51 and the heat plate 50 are securely assembled together.

Referring to FIGS. 1-5, the electrical connector is soldered on the printed circuit board 2, the CPU 4 is received in the electrical connector 3, and the heat dissipating device is disposed onto the CPU 4 and fixed to the printed circuit board 2 by screws 7. Understandably, the clips 6 exert a balanced downward force on the CPU 4 to make a robust electrical connection between the CPU 4 and the electrical connector 3.

Figure 6:
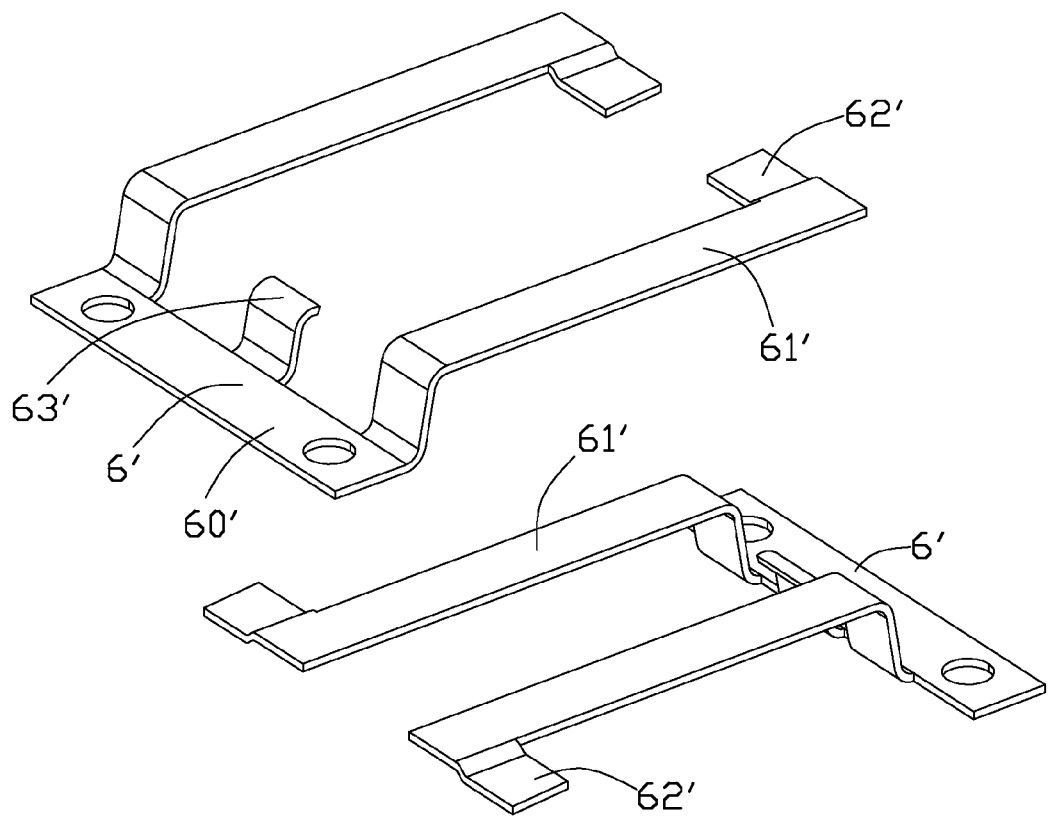
FIG. 6 is an exploded perspective view of an alternative load plate of the electrical connector assembly.

FIG. 6 shows an alternative load plate of the present invention, including a pair of clips 6' with different configurations. The first one of the clip 6' has two cantilever arms 61' with a larger space therebetween than that of the second clip 6'. The two cantilever arms 61' of the first clip 6' include two interlocking portions 62' extending toward each other, and the two cantilever arms 61' of the second clip 6' include two interlocking portions 62' extend away from each other, so the second clip 6' is partially positioned in the space formed by the two cantilever arms 61' of the first clip 6'. In addition, the tongue 63' is disposed in a middle of the base portion 60'.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector assembly electrically connecting a CPU and a printed circuit board, comprising:
    an electrical connector mounted on the printed circuit board, and the CPU mounted upon the connector; and
    a heat dissipating device having a load plate mounted upon the CPU under condition that heat from the CPU is absorbed by the heat dissipating device, the load plate having two clips, and each clip having at least one cantilever arm extending toward the other clip, and at least one clip mating with the cantilever arm of the other clip, the heat dissipating device further comprising a heat pipe and a heat plate, and the load plate being sandwiched between the heat plate and the heat pipe.

2. The electrical connector assembly as claimed in claim 1, wherein each clip includes a base portion for being mounted to the printed circuit board.

3. The electrical connector assembly as claimed in claim 2, wherein a tongue extends upwardly from the base portion and is located below the heat pipe so as to provide an upwardly force to the heat pipe.

4. The electrical connector assembly as claimed in claim 3, wherein each clip had two cantilever arms of the clip which are parallel to each other, and each cantilever has a interlocking portion extending under a bottom surface of another cantilever arm of the other clip.

5. The electrical connector assembly as claimed in claim 1, wherein the two clips have the same configurations.

6. An electrical connector assembly comprising:
    a printed circuit board;
    an electrical connector mounted upon the printed circuit board;
    an electronic package electrically and mechanically connected to the connector;
    a heat plate defining a bottom face intimately and compliantly covering a top face of the electronic package;
    a heat pipe soldered, in a vertical direction, upon an upper face of the heat plate and extending along a first horizontal direction; and
    a pair of clips discrete from each other in said first horizontal direction and respectively secured to the printed circuit board beside the connector; wherein
    said pair of clips approach two side of said heat plate in said first horizontal direction, and at least one of said clips includes a resilient arm extending over the heat plate toward and detachably interlocked to the other so as to impose a downward force upon the heat plate for assuring efficient thermal transfer between the heat plate and the electronic package under condition that said pair of clips forms blocking portions to prevent downward movement of the heat pipe whereby a subassembly of the heat plate and the associated heat pipe are restrained by said pair of clips in the vertical direction and at least the first horizontal direction.

7. The electrical connector assembly as claimed in claim 6, wherein said subassembly is further restrained by said pair of clips in a second horizontal direction perpendicular to both said first horizontal direction and said vertical direction.

8. The electrical connector assembly as claimed in claim 7, wherein at least one of said pair of clips includes an interlocking portion extending in said second horizontal direction to engage the other for joining said pair of clips together.

9. The electrical connector assembly as claimed in claim 8, wherein each of said pair of clips is equipped with said interlocking portion so as to restrain said pair of clips from moving in the vertical direction relative to each other.

10. The electrical connector assembly as claimed in claim 9, wherein at least one of said clips includes two said resilient arms spaced from each other in said second horizontal direction to sandwich the heat pipe therebetween.

11. The electrical connector assembly as claimed in claim 6, wherein said blocking portions extend upward toward the heat pipe.

12. An electrical connector assembly electrically connecting a CPU and a printed circuit board, comprising:
   an electrical connector mounted on the printed circuit board, and the CPU mounted upon the connector; and
   an adjustable load plate for depressing a heatsink arrangement onto the CPU disposed on the connector, comprising;
   a first clip including a first base portion and a pair of first depressing bars cantilevered from the base portion, each of the first depressing bars comprising a horizontal arm and an interlocking portion extending perpendicularly to the horizontal arm; and
   a second clip including a second base portion and a pair of second depressing bars cantilevered from the second base, each of the second depressing bars comprising a horizontal arm and an interlocking portion extending perpendicularly to the horizontal arm, the interlocking portions of the first clip being engaged with bottom surfaces of the horizontal portions of the second clip and the interlocking portions of the second clip being engaged with bottom surfaces of the horizontal portions of the first clip.

13. The electrical connector assembly as claimed in claim 12, wherein a tongue extends upwardly from each base portion and is disposed between the pair of depressing bars.

14. The electrical connector assembly as claimed in claim 12, wherein the horizontal arm extends in the higher horizontal plane than that of the interlocking portion, and a height difference is substantially equal to a thickness of the horizontal arm.

15. The electrical connector assembly as claimed in claim 14, wherein all the horizontal arms of the first and the second clips are displaced in the horizontal plane.

16. The electrical connector assembly as claimed in claim 15, wherein the tongue is lower than the horizontal plane.

17. The electrical connector assembly as claimed in claim 14, wherein the first and the second clips have the same configurations, the two interlocking portions of the two horizontal arms of the first or the second clip extend toward a same direction, and the tongue is not disposed in a middle of the cantilever arms.

18. The electrical connector assembly as claimed in claim 12, wherein the base portion has a plurality of holes for securing.

19. The electrical connector assembly as claimed in claim 14, wherein the first and the second clips have different configurations, the two interlocking portions of the two horizontal arms of the first or the second clip extend toward each other, and the interlocking portions of the other clip extend away from each other.

20. The electrical connector assembly as claimed in claim 19, wherein each clip has a tongue located in a middle of the horizontal arms.

* * * * *